United States Patent [19]
Nabors et al.

[11] Patent Number: 5,517,523
[45] Date of Patent: May 14, 1996

[54] BRIDGE-TAP EQUALIZER METHOD AND APPARATUS

[75] Inventors: David H. Nabors; David P. Nelson, both of Huntsville, Ala.

[73] Assignee: Motorola, Inc., Schaumburg, Ill.

[21] Appl. No.: 78,944

[22] Filed: Jun. 16, 1993

[51] Int. Cl.[6] .................................. H03G 11/04; H03G 5/00
[52] U.S. Cl. ........................... 375/228; 375/229; 333/18; 333/28 R
[58] Field of Search ........................ 333/18, 28, 138, 333/141; 360/65; 330/75, 85, 94, 109; 375/229–232, 228

[56] References Cited

U.S. PATENT DOCUMENTS

| | | | |
|---|---|---|---|
| 3,736,517 | 5/1973 | Lim | 333/28 R |
| 3,749,895 | 7/1973 | Kao | 333/18 |
| 3,781,722 | 12/1973 | Pierson | 333/28 R |
| 3,824,413 | 7/1974 | Awipi | 330/109 |
| 4,080,580 | 3/1978 | Takasaki | 333/28 R |
| 4,140,983 | 2/1979 | Tamori | 333/18 |
| 4,187,479 | 2/1980 | Ishizuka | 333/28 R |
| 4,229,716 | 10/1980 | Levi | 333/28 R |
| 4,424,498 | 1/1984 | Murray | 333/18 |
| 4,500,999 | 2/1985 | Takatori | 333/28 R |
| 4,745,622 | 5/1988 | Gupta | 375/14 |
| 4,764,938 | 8/1988 | Meyer | 375/14 |
| 4,833,691 | 5/1989 | Takatori | 375/14 |
| 4,862,103 | 8/1989 | Funada | 330/304 |

*Primary Examiner*—Sandra L. O'Shea
*Assistant Examiner*—John Ning
*Attorney, Agent, or Firm*—Nancy R. Gamburd

[57] ABSTRACT

An equalizer (100) is suitable for removing the delay distortion from a switched digital signal received from a telephone channel, where the delay distortion is caused by a bridge-tap connected to the telephone channel. The equalizer includes a feedback delay circuit (200) which is arranged to delay the output signal (150) by an amount of time based on the square of the predominant frequency of the output signal. The resulting delayed feedback signal (130) is then combined with the input signal, thereby compensating for the delay distortion. The equalizer also includes an amplifier (103) which may be adjusted to compensate for the attenuation distortion caused by the bridge-tap.

19 Claims, 1 Drawing Sheet

BRIDGE-TAP EQUALIZER METHOD AND APPARATUS

FIELD OF THE INVENTION

This application relates to equalizers including, but not limited to, a bridge-tap equalizer method and apparatus.

BACKGROUND OF THE INVENTION

It is known to provide switched digital services via two-wire telephone channels. Modern digital services, for example, are capable of providing switched digital rates of up to 160 Kbps. A typical problem with providing such service, however, is that the telephone line may include a bridge-tap on the line. This bridge-tap results in a received signal that includes an amount of bridge-tap distortion.

In the past, the compensation for bridge-tap distortion on lower speed lines has consisted of implementing an echo cancellation stage in a digital signal processor ("DSP"). While a DSP solution provides adequate compensation for bridge-tap line connections at the voice and lower speed modem frequencies, the DSP approach is not a cost-effective solution at the 160 Kbps switched digital rates due to the clock speed required to provide the necessary sampling rate.

As a result, there is a need to provide a hardware-based bridge-tap equalizer that is capable of compensating for bridge-tap distortion at rates of 160 Kbps.

DESCRIPTION OF THE PREFERRED EMBODIMENT

An unterminated bridge-tap connection can be modeled using a fixed time delay and attenuation determined by the length and loss characteristics of the bridge-tap line. The bridge-tap distortion comprises an attenuation distortion component and a delay distortion component. The resulting distortion can be removed from the received signal I by using the arrangement of FIG. 1.

Figure 1:
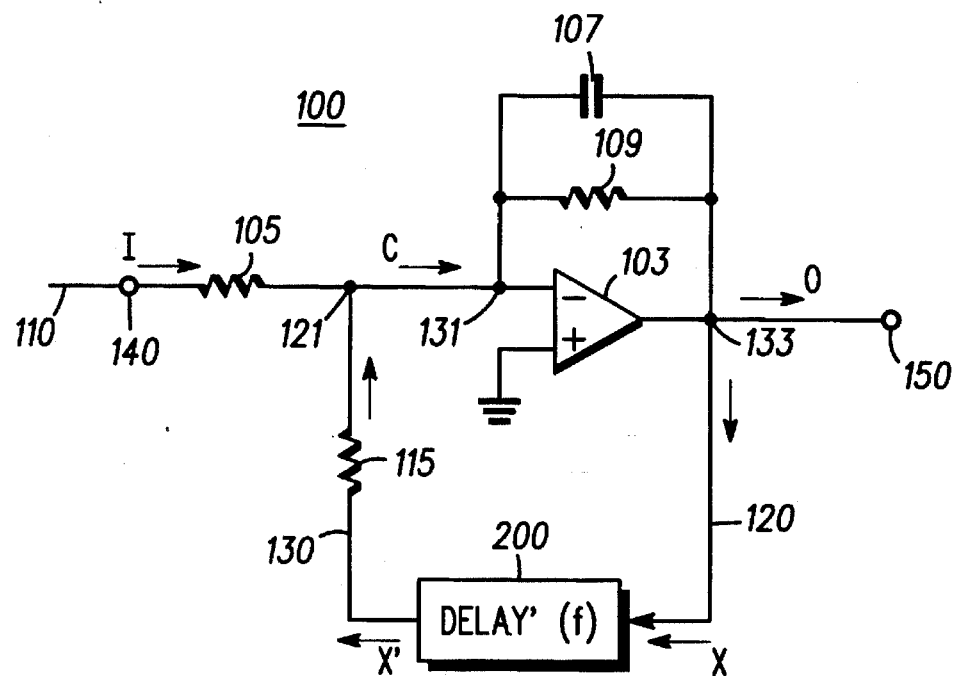
FIG. 1 is a block diagram that shows a first embodiment 100 of a bridge-tap equalizer, in accordance with the present invention.

Referring to FIG. 1, there is shown a first embodiment of a bridge-tap equalizer, in accordance with the present invention. As shown, the equalizer includes a delay circuit 200 and a summing amplifier 103. The input signal 140, designated I, includes delay distortion and attenuation distortion caused by a bridge-tap connection that is coupled to the input telephone line 110. In FIG. 1, the bridge-tap itself is not shown. The input signal I is coupled to a summing junction 121 via a resistor 105. The summing junction 121 combines the input signal I with a first feedback signal, designated X', via a resistor 115, thus forming a combined signal, designated C. The combined signal C is then applied to a summing amplifier 103. The summing amplifier 103 provides an output signal, designated O, at terminal 133, the output signal including a predominant frequency, f. The summing amplifier 103 is also coupled to a feedback resistor 109, a feed-back capacitor 107, and a delay circuit 200. A second feedback signal, designated X, is formed at the terminal 133, the second feedback signal X being based on the output signal O. As shown, the second feedback signal X is applied to the input 120 of the delay circuit 200. The delay circuit 200, in turn, is arranged to delay the second feedback signal X by an amount of time based on f to compensate for the delay distortion component, thus forming the first feedback signal X' at the delay circuit output 130. It will be appreciated that the feedback signal X' is 180 degrees out-of-phase with the delay distortion component present in the input signal I. As a result, combining these signals I and X' in the summing junction 121 results in subtracting, or removing, the delay distortion component from the output signal O.

Referring still to FIG. 1, the attenuation distortion component is compensated by the gain of the summing amplifier 103. This gain is set by the ratio of the value of the resistor 109, expressed in ohms, to the value of the resistor 115, expressed in ohms. Thus, $$\text{GAIN} = \frac{R_{109}}{R_{115}} \quad \text{(Equation 1)}$$

where $R_{109}$ and $R_{115}$ are expressed in ohms, and GAIN is expressed as a ratio.

The resulting output signal 150 has substantially all of the attenuation distortion component and the delay distortion component removed therefrom.

Still referring to FIG. 1, it is seen the summing amplifier 103 includes a compensating capacitor 107. This capacitor 107 is used to set the upper corner frequency for the equalizer's pass band. Thus, the upper −3 dB frequency is computed as the inverse of the quantity $2\pi$ times the value of the capacitor 107, expressed in farads, times the value of the resistor 109, expressed in ohms. Thus:

$$\text{UPPER CUT-OFF FREQUENCY} = \frac{1}{2\pi R_{109} C_{107}} \quad \text{(Equation 2)}$$

where $R_{109}$ is expressed in ohms, $C_{107}$ is expressed in farads, and UPPER CUT-OFF FREQUENCY is expressed in Hertz (Hz).

Figure 2:
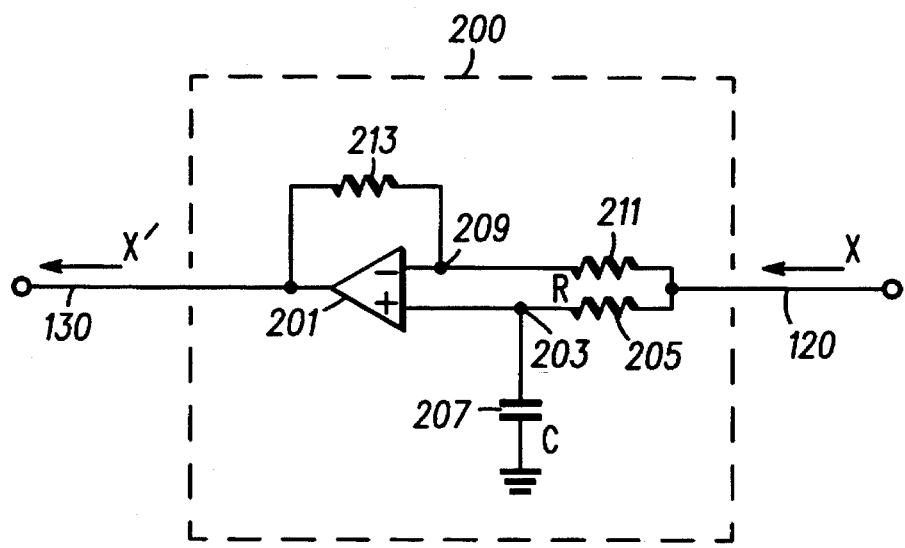
FIG. 2 shows further detail for FIG. 1.

Referring to FIG. 2, there is shown more detail for the delay circuit 200. As shown, the delay circuit 200 comprises an amplifier 201, the amplifier including a positive input 203 and a negative input 209. As shown, the feedback signal X is coupled to the positive input 203 by means of a resistor 205, the resistor 205 having a value of R ohms. The positive input 203, in turn, is coupled to ground by means of a capacitor 207, the capacitor 207 having a value of C farads. The amplifier 201 forms the delayed feedback signal X' at lead 130, the delayed feedback signal X' being based on the feedback signal X delayed by an amount of time based on the square of the predominant frequency of the output signal, $f^2$, as follows:

$$\text{DELAY} = \frac{K_1}{1 + K_2 f^2}, \quad \text{(Equation 3)}$$

where DELAY is expressed in seconds, $K_1 = 2RC$, and $K_2 = (2\pi RC)^2$.

Typically, the input signal 140 will contain more than one frequency. Therefore, the output signal 150 will also contain more than one frequency. As a result, the delay circuit 200 is arranged to provide a delay value based on the predominant frequency component of the output signal 150.

As an example, let it be assumed that the equalizer 100 is connected to a 2-wire telephone line including 0.3 kilometer (km) of 26 gauge bridge-tap, and that the input signal comprises a 160 Kbps digital data signal.

First, the predominant frequency component of the output signal must be determined. For the given input signal, f is determined as the Nyquist frequency of the 160 Kbps data rate, or 80 KHz. Thus, f=80 KHz.

Second, the delay contributed by the bridge-tap must be determined, either empirically or from a look-up table. For a bridge-tap of 0.3 km of 26 gauge conductors, the delay is determined to be $1.6 \times 10^{-6}$ seconds, or 1.6 microseconds. The above Equation 3 may now be used to determine the value of resistor 205, or R, and the value of the capacitor 207, or C. Solving the above Equation 3 yields an RC value of $10^{-3}$. As a result, an acceptable value for R (resistor 205) is $3 \times 10^3$ ohms, or 3K-ohms, and an acceptable value for C (capacitor 207) is $330 \times 10^{-12}$ farads, or 330 pF.

Third, the loss contributed by the bridge-tap must be determined, either empirically or from a look-up table. For a bridge-tap of 0.3 km of 26 gauge wire, the loss is determined to be 3.8 dB. The above Equation 1 may now be used to determine the value of resistors 109 and 115. Since the bridge-tap loss equals 3.8 dB, then the values of resistors 109 and 115 must be adjusted to provide a gain equal to 3.8 dB to offset this loss. Thus, the above Equation 1 yields an $R_{109}/R_{115}$ value equal to 1.55. As a result, an acceptable value for the resistor 109 is $10 \times 10^3$ ohms, or 10 K-ohms, and an acceptable value for the resistor 115 is $6.4 \times 10^3$ ohms, or 6.4K-ohms.

Fourth, let it be assumed that it is desired to set the upper cut-off frequency equal to approximately 106 KHz. Solving the above Equation 2 yields an $R_{109}C_{107}$ product of $1.5 \times 10^{-6}$. Since the value of resistor 109 has previously been determined to be 10K-ohms, then the corresponding value of capacitor 107 may be calculated as $150 \times 10^{-12}$ farad, or 150 pF.

All component values for this example (predominant signal frequency of 80 KHz, 0.3 km of 26 gauge bridge-tap yielding 1.6 microseconds of delay and 3.8 dB of loss, and upper cut-off frequency of 106 KHz) are as follows:

| Element | Component | Value | Units |
|---------|-----------|-------|-------|
| 105 | resistor | 10K | ohms |
| 107 | capacitor | 150 p | farads |
| 109 | resistor | 10K | ohms |
| 115 | resistor | 6.4K | ohms |
| 205 | resistor | 3K | ohms |
| 207 | capacitor | 330 p | farads |
| 213 | resistor | 10K | ohms |

Those skilled in the art will appreciate that the amplifiers 103 and 201 may comprise, for example, operational amplifier units.

Thus, there is disclosed an equalizer 100 that is suitable for removing distortion from an input signal received from a telephone channel 110. The distortion is caused by a bridge-tap connected to the telephone channel, the distortion including a delay distortion component and an attenuation distortion component. The equalizer is arranged to provide an output signal 150, the output signal including a predominant frequency. The equalizer includes a feedback delay circuit 200 which is arranged to delay the output signal by an amount of time based on the square of the predominant frequency, thus forming a delayed feedback signal 130. The delayed feedback signal is then combined with the input signal, thereby compensating for the delay distortion component. The equalizer further includes an amplifier 103 coupled to the output signal, the amplifier being adjustable to compensate for the attenuation distortion component.

One key difference between a bridge-tap equalizer method and apparatus, in accordance with the present invention, and the prior art is that the present method and apparatus is implemented as an amplifier-based circuit, thereby providing continuous operation as opposed to a discrete, sampled implementation, as in the prior art DSP techniques.

In one embodiment, a bridge-tap equalizer apparatus, in accordance with the present invention, was tested with unterminated taps ranging from 0.1 km to 1.5 km with variable resistance values for the resistor 205 to adjust the delay compensation value as per Equation 3 and for the resistor 115 to adjust the gain compensation value as per Equation 1 with excellent results. At the 160 Kbps data rate, bridge-taps over 0.5 km were sufficiently attenuated where no compensated was required. The bridge-tap lengths between 0.3 km and 0.5 km required compensation to remove the frequency-dependent distortion caused by the time delay and low attenuation of these unterminated lines. The bridge-tap line lengths required compensation depending on the Nyquist frequency of the data rate and the attenuation per line length of the unterminated connection.

One key advantage of a bridge-tap equalizer method and apparatus, in accordance with the present invention, is that it provides a low-cost solution for compensation of unterminated line connections on a high-speed switched digital line. Moreover, a bridge-tap equalizer method and apparatus, in accordance with the present invention, may be utilized for other high-rate digital two-wire receivers with the only limitation being the bandwidth characteristics of the operational amplifiers used.

While various embodiments of a bridge-tap equalizer method and apparatus, in accordance with the present invention, have been described hereinabove, the scope of the invention is defined by the following claims.

What is claimed is:

1. In an equalizer having an input signal, the input signal including delay distortion, a method for substantially removing the delay distortion from the input signal, the method comprising the steps of:

(a) forming an output signal based on combining the input signal with a first feedback signal, the output signal having a predominant frequency, f, related to a Nyquist frequency of the input signal;

(b) providing a second feedback signal based on the output signal; and, (c) delaying the second feedback signal by an amount of time based on the predominant frequency f to compensate for the delay distortion, thus forming the first feedback signal.

2. The method of claim 1 wherein the forming step (a) includes a step of subtracting.

3. The method of claim 2 wherein the amount of time is based on $f^2$.

4. The method of claim 3 wherein the amount of time is based on $$\frac{K_1}{1 + K_2 f^2},$$

where $K_1$ and $K_2$ are predetermined.

5. The method of claim 4 wherein the delaying step (c) is performed using an amplifier.

6. The method of claim 5, the amplifier including an input, the feedback signal being coupled to the input by means of a resistor, the resistor having a value of R ohms.

7. The method of claim 6, the input coupled to ground by means of a capacitor, the capacitor having a value of C farads.

8. The method of claim 7, wherein $K_1 = 2RC$ and $K_2 = (2\pi RC)^2$.

9. The method of claim 8 where the forming step (a) includes a step of amplifying.

10. The method of claim 9 wherein the equalizer is arranged for coupling to a telephone channel.

11. The method of claim 10 wherein the telephone channel includes a bridge-tap, the bridge-tap including a delay distortion characteristic, and the delaying step (d) is predetermined to substantially match the delay distortion characteristic of the bridge-tap.

12. An equalizer having an input signal, the input signal including delay distortion, the equalizer arranged for substantially removing the delay distortion from the input signal, the equalizer comprising:

forming means for forming an output signal based on combining the input signal with a first feedback signal, the output signal having a predominant frequency, f, related to a Nyquist frequency of the input signal;

providing means for providing a second feedback signal based on the output signal; and, delaying means for delaying the second feedback signal by an amount of time based on the predominant frequency f to compensate for the delay distortion, thus forming the first feedback signal.

13. The equalizer of claim 12 wherein the amount of time is based on $f^2$.

14. The equalizer of claim 13 wherein the amount of time is based on $$\frac{K_1}{1+K_2 f^2},$$

where $K_1$ and $K_2$ are predetermined.

15. The equalizer of claim 14 wherein the delaying means includes an amplifier.

16. The equalizer of claim 15, the amplifier including an input, the feedback signal being coupled to the input by means of a resistor, the resistor having a value of R ohms.

17. The equalizer of claim 16, the input coupled to ground by means of a capacitor, the capacitor having a value of C farads.

18. The equalizer of claim 17, wherein $K_1=2RC$ and $K_2=(2\pi RC)^2$.

19. An equalizer that is suitable for removing distortion from an input signal received from a channel, the distortion including a delay distortion component and an attenuation distortion component, the equalizer comprising:

an output, the output having an output signal, the output signal having a predominant frequency related to a Nyquist frequency of the input signal;

an amplifier coupled to the output signal, the amplifier having an adjustable gain to compensate for the attenuation distortion component; and a feedback delay circuit coupled to the output and to the amplifier, the feedback delay circuit arranged to delay the output signal by an amount of time based on the square of the predominant frequency to form a delayed feedback signal, the delayed feedback signal being then coupled to the input signal and thereby compensating for the delay distortion component in the output signal.

\* \* \* \* \*